(12) United States Patent
Skibicki et al.

(10) Patent No.: US 7,982,853 B2
(45) Date of Patent: Jul. 19, 2011

(54) LITHOGRAPHIC METHOD FOR MASKLESS PATTERN TRANSFER ONTO A PHOTOSENSITIVE SUBSTRATE

(75) Inventors: Dariusz Skibicki, Bydgoszcz (PL); Tomasz Paczkowski, Bydogoszcz (PL); Piotr Domanowski, Solec Kujawski (PL)

(73) Assignee: Radove GmbH, Berlin (DE)

( * ) Notice: Subject to any disclaimer, the term of this patent is extended or adjusted under 35 U.S.C. 154(b) by 734 days.

(21) Appl. No.: 11/913,416

(22) PCT Filed: May 1, 2006

(86) PCT No.: PCT/IB2006/001095
§ 371 (c)(1),
(2), (4) Date: Nov. 2, 2007

(87) PCT Pub. No.: WO2006/117642
PCT Pub. Date: Nov. 9, 2006

(65) Prior Publication Data
US 2008/0266536 A1 Oct. 30, 2008

Related U.S. Application Data

(60) Provisional application No. 60/677,019, filed on May 2, 2005.

(51) Int. Cl.
*G03B 27/32* (2006.01)
*G03B 27/42* (2006.01)
*G03B 27/54* (2006.01)
*G02B 26/08* (2006.01)
*G02B 7/182* (2006.01)

(52) U.S. Cl. ......... 355/67; 355/53; 355/77; 359/198.1; 359/199.1; 359/212.1; 359/877; 359/881

(58) Field of Classification Search ............... 250/492.2, 250/492.22; 355/52, 53, 55, 67, 68, 69, 75, 355/77; 359/196.1, 197.1, 198.1, 201.1, 359/201.2, 212.1, 359, 871, 872, 877, 881; 430/22
See application file for complete search history.

(56) References Cited

U.S. PATENT DOCUMENTS 5,672,464 A 9/1997 Nelson
(Continued)

OTHER PUBLICATIONS

Dauerstäet al., Application of Spatial Light Modulators for Microlithography, Proceedings of SPIE vol. 5348 (SPIE, Bellingham, WA, 2004), pp. 119-126.

*Primary Examiner* — Hung Henry Nguyen
*Assistant Examiner* — Colin Kreutzer
(74) *Attorney, Agent, or Firm* — Motteli & Associates SàRL

(57) ABSTRACT

The invention proposes a Subpixel Scroll method, which optically shifts the position of the mirror elements to the projection axis by one subpixel size each, with an additional 45° mirror between DMD and projection optics. The 45° mirror is shifted by ¼ mirror element width by means of a controllable actuator. The size of this change of position and the time are synchronized in such a way by the position indicator signals of the scan sled that the mirror element seems to stand relative to the substrate surface element. This resetting is however not bound to the DMD-switching speed of 10 kHz. Among other advantages, the invention reduces the blur at the edge transition by the higher resolution and facilitates a higher scan velocity, whereby the scan velocity depends on the dynamics of the actuator, the effective UV-power of the UV-source and the sensitivity of the photosensitive polymer.

17 Claims, 4 Drawing Sheets

U.S. PATENT DOCUMENTS

| | | |
|---|---|---|
| 6,177,980 B1 | 1/2001 | Johnson |
| 6,356,340 B1 | 3/2002 | Spence |
| 6,556,279 B1 * | 4/2003 | Meisburger et al. ............ 355/69 |
| 2002/0012110 A1 | 1/2002 | Luellau et al. |
| 2005/0041229 A1 | 2/2005 | Meisburger |
| 2005/0046819 A1 | 3/2005 | Bleeker et al. |
| 2006/0110665 A1 * | 5/2006 | Bleeker et al. .................. 430/22 |
| 2006/0215133 A1 * | 9/2006 | Hazelton ........................ 355/52 |

* cited by examiner

LITHOGRAPHIC METHOD FOR MASKLESS PATTERN TRANSFER ONTO A PHOTOSENSITIVE SUBSTRATE

The present application is the U.S. National Stage of PCT Patent Application no PCT/IB2006/001095 which claims priority under the Paris Convention to prior filed U.S. Provisional Patent Application, Ser. No. 60/677,019, filed 2 May 2005, the contents of both of which are incorporated herein by reference thereto and relied upon.

FIELD OF THE INVENTION

The present invention is in the field of radiation imaging and devices and processes therefor. More specifically, the present invention relates to forming the likeness of an instrumented phenomenon in a receiver wherein the radiation produces a chemical reaction, and still more specifically relates to the maskless transfer of patterns onto photosensitive substrates.

BACKGROUND OF THE INVENTION

In the production of microelectronic devices, photo-lithographic methods are used to transfer patterns onto photosensitive substrates to produce integrated circuits. A device suitable for maskless photo-lithographic pattern transfer is a "digital mirror device" (DMD), e.g. from Texas Instruments. A DMD comprises a micro-mirror array having about 1 million individually adjustable mirror elements. Tilting the mirror elements of the mirror array produces a pattern of radiating and not radiating mirror elements, which pattern is imaged with a projection optics or ray trap means onto the photosensitive substrate. Under computer control, various patterns can be produced and be maskless photo-lithographically transferred to the substrate. With a reproduction ratio of 1:1, a substrate surface of ~10×14 mm is exposed.

The state of the art in the use of DMD's for the maskless lithographic transfer uses two principle methods in order to expose larger substrate surfaces: (1) the static step-and-repeat method, and (2) the scrolling method. The step- and repeat method (1) splits the picture information of the entire substrate into ~10×14 mm partial fields, which are transferred consecutively with the illumination optics, with accurate edges onto the substrate. The continuous scrolling method (2) can be described as the exposure of a substrate surface element (pixel) by a mirror element. Mirror element and substrate surface element move relatively to each other with precisely controlled speed.

In order for the photolithographically produced substrate a surface element having the same length as the mirror element (with magnification 1:1), the relative movement may only have exactly one mirror element length. This condition is realized by the characteristic of the mirror array to be able to load new image information while the last image is still kept as pattern on the mirror elements. If due to this a pattern, set back by one mirror element, is loaded and switched through after a relative movement of a mirror element length of mirror array and substrate with respect to each other, a scrolling method develops, with which the mirror pattern appears to stand with respect to the substrate. However, a blur of pixel width develops at each edge.

Both methods have disadvantages. With the step-and-repeat method thousands of :-exact positionings have to be carried out, leading to more complex mechanics and to large dead times. The scrolling method accomplishes the uniform feed motion at the cost of "smeared" edge transitions and with a scan velocity limited by the mirror switching frequency, for example with a imaging ratio of 1:1~135 mm/second. The mentioned scrolling methods additionally require a precisely controlled speed, thus inexpensive toothed belt drives are not usable. Accelerating and deceleration above the substrate during the exposure are not possible.

The state of the art is defined principally by U.S. Pat. No. 5,672,464, and U.S. Pub. Nos. 2005/0041229A, 2002/0012110A1, and 2005/0046819A1, the contents of which are incorporated by reference hereto and relied upon.

SUMMARY OF THE INVENTION

The present invention is a "Subpixel Scroll Method," which uses an additional 45° mirror between DMD and projection optics to optically shift the position of the mirror elements relative to the projection axis by one subpixel size each. In a preferred embodiment, the 45° mirror is shifted by ¼ the width of a mirror element by a controllable actuator. The size of this change of position and the time point are synchronized by the position indicator signals of the scan sled in such a way that the mirror element (as with the standard scrolling method) seems to stand relative to the substrate surface element. Differently than with the standard scrolling method is the resetting, which however is not bound to the DMD switching speed of 10 kHz. Due to its higher resolution, the present invention reduces the blur at the edge transition and makes a higher scan velocity possible, whereby the scan velocity depends on the dynamics of the actuator, the effective UV-power of the UV source and the sensitivity of the photosensitive polymer. A further advantageous function of the present invention is the possibility of transferring a pattern with higher resolution than given by the mirror element size. For an increase of the resolution in X (scan direction) and Y (perpendicular to the scan direction) two mirror actuators are necessary, which work in X and Y.

BRIEF DESCRIPTION OF THE DRAWINGS

FIG. 2b shows the status after the 1st step of correction. The mirror actuator 202 has shifted the bundle of UV rays 200 of the mirror element 201a by ½ pixel. However, the bundle of UV rays 200 has the same position relative to the substrate surface element 210 as in FIG. 2a.

DETAILED DESCRIPTION OF THE INVENTION

Figure 1:
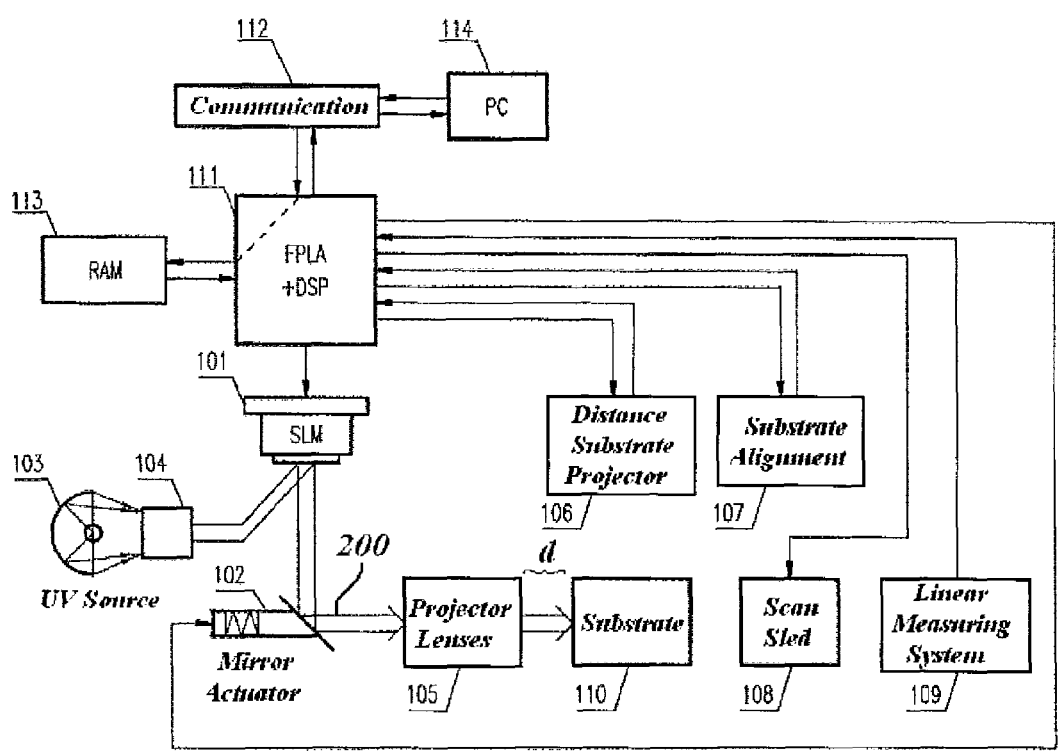
FIG. 1 shows a diagram of the maskless photo-lithographic system, which implements the subpixel scroll method disclosed by the invention.

Referring now to the drawings, the details of preferred embodiments of the present invention are graphically and schematically illustrated. Like elements in the drawings are represented by like numbers, and any similar elements are represented by like numbers with a different lower case letter suffix.

Referring now to of FIG. 1, a maskless lithographic system is shown, which implements the Subpixel Scroll method disclosed by the invention. This lithographic system contains a UV radiation source 103, a UV condensor optic 104, a Spatial Light Modulator (SLM) 101 (in this implementation, the SLM is a digital mirror device (DMD), see for example, the Discovery 1100™ of Texas Instruments), a UV projection lens system 105 and a 45° mirror actuator 102. The beams reflected by the SLM 101 are optically shifted along the projection axis 208 controlled by the 45° mirror actuator 102. Additionally, FIG. 1 shows the control system of digital signal processor (DSP) and free programmable logic array (FPLA) 111, that controls all functions of the lithographic system. In a computer system (PC) 114 the layout data of a pixel pattern are prepared.

For a preferred substrate format 600×500 mm and a preferred resolution of 12.7: per pixel, the size of the prepared data set is about 275 megabyte. This amount of data is transferred via a fast communication means 112 to the RAM 113. The exact distance d of the projector optics 105 to the substrate 110 is measured and adjusted constantly by the distance substrate projector feature 106 of the DSP/FPLA 111. Before beginning the exposure, each new substrate 110 is measured :-exactly and aligned to the scan direction of the scan sled 108 by the substrate alignment feature 107 of the DSP/FPLA 111. The linear measuring system 109 supplies the trigger signals for the :-exact synchronisation of all switching processes of the SLM 101, and the optical displacement of the reflected UV beams 200 by the mirror actuator 102.

The synchronization of all switching processes with only the position indicator signals makes the :-exact lithographic transfer of the patterns independent of the speed of the projection optics relative to the substrate. At low speed about the point of reversal of the scan direction, the UV energy is controlled by variation of the on-off relationship of the mirror elements 201.

FIGS. 2*a*-2*f* show the process of the present subpixel scroll method with the exposure of a substrate surface element by three mirror elements. In this example, each step of correction by the 45° mirror actuator amounts to 0.5 pixels (6.35:). In the embodiment illustrated in the figures, the 45° mirror actuator has a total correction potential of 2 pixels, i.e., after four steps of correction of 0.5 pixels each, the 45° mirror actuator must be pulled back to the zero value (reset). However, any number of correction steps may be practiced in the present invention under appropriate process control and scale of the actuator mirror 102. The subpixel scroll method is described with the drawings FIGS. 2*a*-2*f*.

Figure 2A:
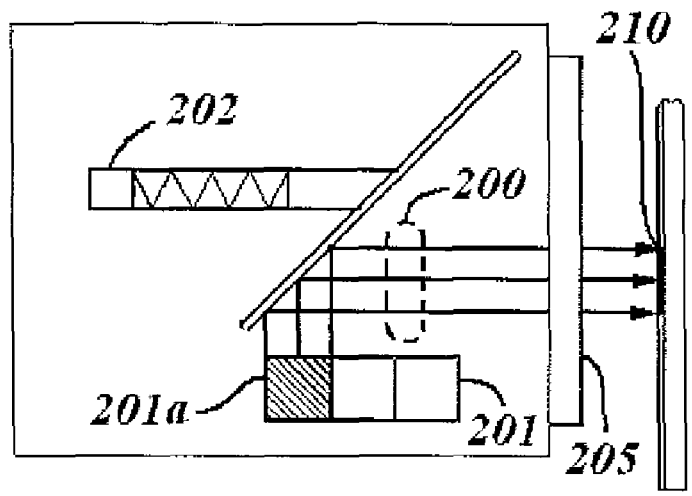
FIG. 2a shows a Spacial Light Modulator with 3 mirror elements.

FIG. 2*a* shows an exemplary SLM 101 with three mirror elements 201. The mirror element in ON-position (hatched) 201*a* reflects a bundle of UV rays 200 via the 45° mirror actuator 202 through the projection optics 205 and onto the associated substrate surface element 210. FIG. 2*a* shows the beginning step of the exposure process. With the 45° mirror actuator 202 at the starting position, substrate 210 and projection optics 205 are moving relative to each other. The path traveled is :-exactly measured with the linear position indicator 209. If a part of the path of 0.5×pixel length=6.35 : is left behind, a correction signal is applied to the 45° mirror actuator 202 by the FPLA/DSP control system 111. The movement of the 45° mirror actuator 202 compensates the shift accumulated in the cycle 2*a* between the substrate 210 and the projection optics 205. During the relative movement of 0.5 pixels, the surface of the substrate surface element was smeared about 0.5 pixels.

Figure 2B:
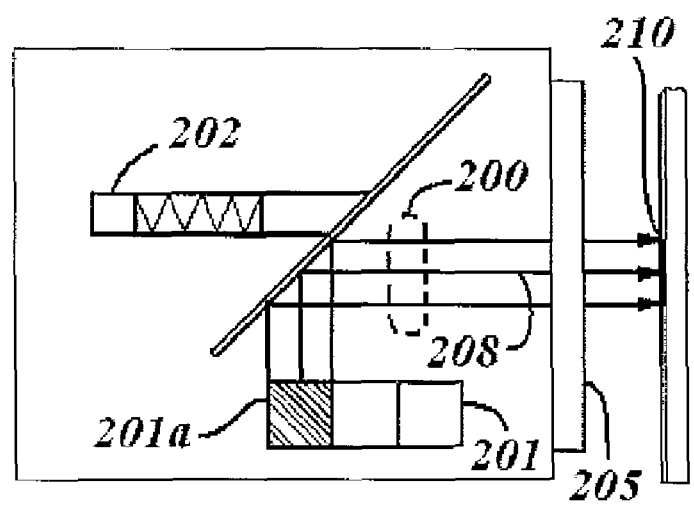

FIG. 2*b* shows the situation after a 1st step of correction: the mirror actuator 202 has shifted the bundle of UV rays 200 of mirror element 201*a* by ½ pixel. The bundle of rays 200 impinges on the same position of the substrate 210 as in the beginning step of the process shown in FIG. 2*a*.

Figure 2C:
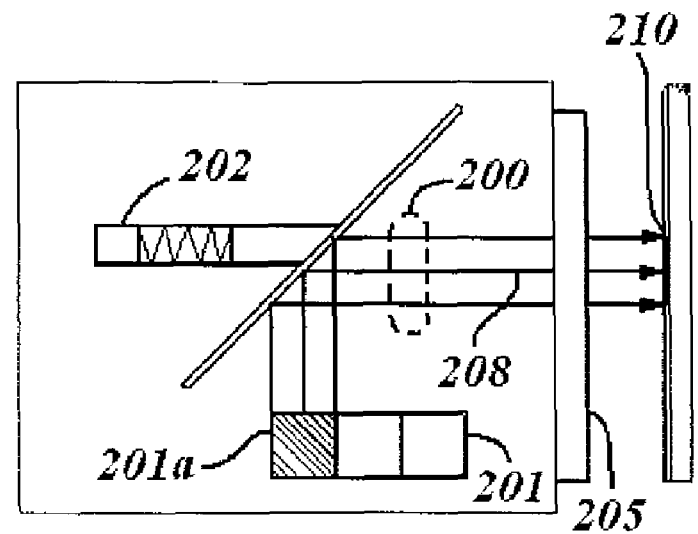
FIG. 2c shows the condition after the 2nd step of correction. The sequence was similar to that of FIGS. 2a and 2b.

FIG. 2*c* shows the situation after the 2nd step of correction, the process was similar to that shown in FIGS. 2*a* and 2*b*, and the bundle of rays 200 impinges on the same position of the substrate 210 as in the beginning step of the process.

Figure 2D:
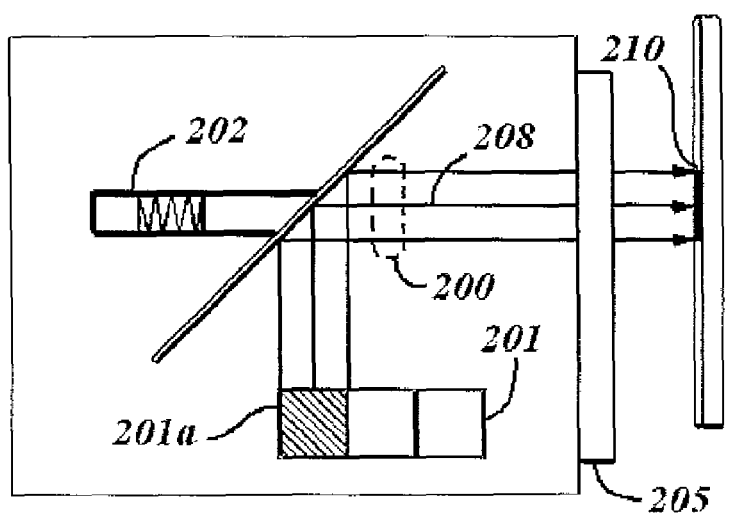
FIG. 2d shows the condition after the 3rd step of correction. The sequence was similar to that of FIGS. 2a, 2b and 2c.

FIG. 2*d* shows the situation after the n-th step of correction, the process was similar to that shown in FIGS. 2*a*, 2*b* and 2*c*. Additional steps of correction are possible under appropriate process control and scale of the actuator mirror 102.

Figure 2E:
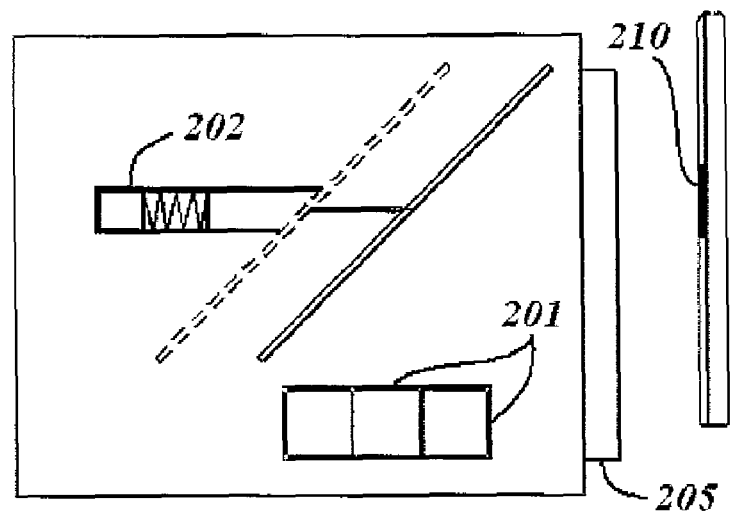
FIG. 2e illustrates the resetting step (zero-resetting phase) of the sequence.

However, in this example, the mirror actuator 202*a* only has a total correction potential of 2.0 pixels. After the carrying out a maximum of four correction step (the n-th correction step of FIG. 2*d*), the mirror actuator must be put back to zero-position. FIG. 2*e* describes the sequence of this zero-resetting phase. After the end of the n-th step of correction, all mirror elements 201 are switched off by the clear-function of the DMD. After switching-off the mirror elements 201*a*, the mirror actuator 202 can be run down to zero without stray exposure of the substrate. At the same time, the next mirror element pattern (e.g., of FIG. 2*f*) is prepared within the logic area of the SLM 101.

Figure 2F:
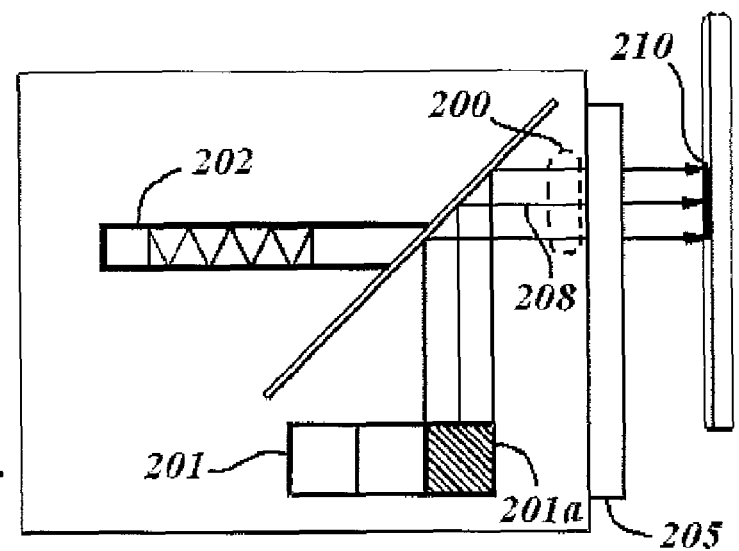
FIG. 2f shows a mirror element pattern.

FIG. 2*f*. After having reached the zero position of the mirror actuator 202, the linear measuring system 109 triggers edge-exactly after 2 pixel lengths (25.4:) the switching in of the mirror element pattern of 2*f*. The sequence of exposure for substrate pixel 210 repeats itself now.

The Subpixel Scroll method exposes a substrate surface element 210 of the substrate 110 while exposure optics and substrate move relative to each other. The blur of the substrate surface element edge depends on the number of correction steps per substrate surface element, can thus amount to 1/10 the width of the substrate surface element (1/20 mil).

The speed of the exposure system is not limited to switching frequency×substrate surface element width, as with known scrolling methods. The maximum scan velocity and thus the exposure time for the entire substrate depends on the correction potential of the mirror actuator, the switching time for loading of a new pattern in the DMD, the resist sensitivity and the effective UV power on the substrate.

FIGS. 3*a*-3*d* show the method for the improvement of the resolution, a more advantageous function of the Subpixel scroll method, the increase of the resolution of the pixel pattern by using of a mirror actuator with deflection possibility in X/Y. The Subpixel Scroll method is advantageous because it increases the resolution of the pixel pattern by usage of a mirror actuator with deflection possibility in X/Y. A substrate surface 301 is to be exposed, which is larger than two substrate surface elements and has edges, which lie in the raster 0.5×width of the substrate surface element. For known maskless lithographic procedures the resolution is fixed by the size of the mirror elements, the smallest raster thus is 1×width of the substrate surface element.

Figure 3A:
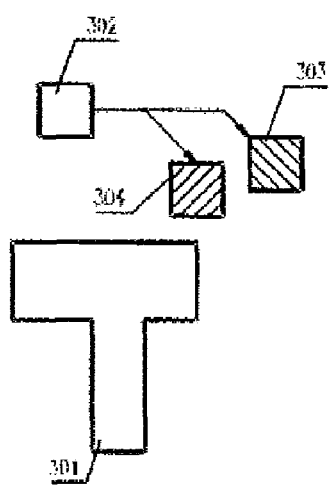
FIG. 3a shows a substrate surface 301 and a mirror element 302, which exposes substrate surface element 303 with the deflection mirror in zero position and substrate surface element 304 with a deflection mirror deflected in X/Y.

In particular, FIG. 3a shows a substrate surface 301 and a mirror element 302, which exposes substrate surface element 303 with the deflection mirror in zero position and substrate surface element 304 with a deflection mirror deflected in X/Y.

Figure 3B:
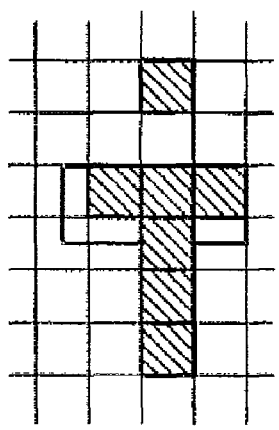
FIG. 3b shows a substrate surface—a program for processing of pixels produces a mirror pattern that exposes 301 as far possible with substrate surface elements 303.

In FIG. 3b, a program for processing of pixels generates a mirror pattern that exposes the surface substrate 301 as far as possible with substrate surface elements 303.

Figure 3C:
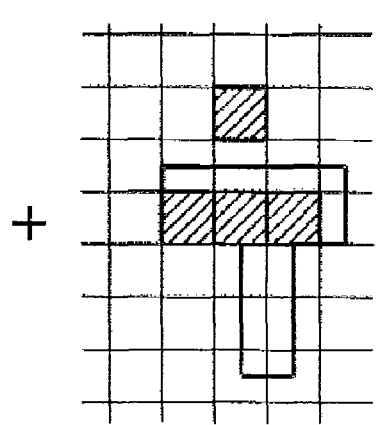
FIG. 3c shows yet another substrate surface—for the non-exposed partial surfaces of the substrate surface a mirror pattern is then produced by the program, which exposes these surfaces as far as possible with substrate surface elements 304.

In FIG. 3c, for the non-exposed partial surface of the substrate surface, then a mirror pattern is generated by the program, which exposes these surfaces as far as possible with substrate surface elements 304. In the corners partial surface squares with an edge length of 0.5×width of a substrate surface element can remain unexposed.

Figure 3D:
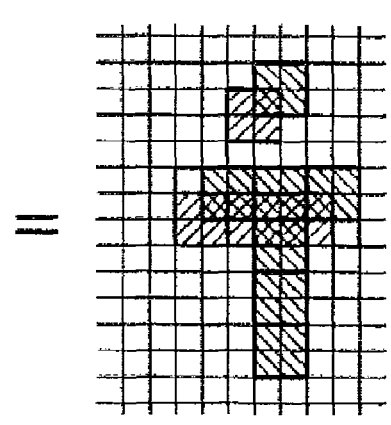
FIG. 3*d* shows the distribution of the exposure in the substrate surface after the exposures shown if FIGS. 3*b* and 3*c*.

FIG. 3d shows the distribution of the exposure energy in the substrate surface after the exposure illustrated in FIGS. 3b and 3c.

In order to avoid unnecessary scan paths, the process steps illustrated in FIGS. 3b and 3c should alternate after having carried out a FIG. 2 cycle during the exposure of the substrate surface. The higher resolution of this method is accomplished by doubling of the exposure time. By introduction of further partitioning steps and exposure passages the resolution potentially can be increased at will.

In an advantage, the present invention reduces the blur at the edge transition and makes a higher scan velocity possible, whereby the scan velocity depends on the dynamics of the actuator, the effective UV-power of the UV source and the sensitivity of the photosensitive polymer.

In another advantage, the present invention provides the possibility of transferring a pattern with higher resolution than given by the mirror element size.

Multiple variations and modifications are possible in the embodiments of the invention described here. Although certain illustrative embodiments of the invention have been shown and described here, a wide range of modifications, changes, and substitutions is contemplated in the foregoing disclosure. In some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. A lithographic method for the maskless transfer of a pattern onto a photosensitive substrate, the method comprising:
   (a) imaging a radiating surface of at least one mirror element of a digital mirror array via a deflecting mirror and a projection optic onto the substrate, wherein the deflecting mirror is movable in a scan direction;
   (b) moving the at least one mirror element, projection optics and a substrate surface clement exposed by the deflecting mirror relative to the substrate so as to result in a change of position of the at least one mirror element, the projection optics, and the substrate surface element;
   (c) continuously measuring the change of position by a measuring system;
   (d) generating a trigger signal after reaching a defined change of position;
   (e) resetting the exposed substrate surface element to a substrate starting position by changing the position of the deflecting mirror in a path of rays, wherein the reset operation is triggered by the trigger signal;
   (f) repeating steps (b) to (c) until a resetting potential of the deflecting mirror is consumed;
   (g) switching off all mirror elements of the digital mirror array, wherein the switching interrupts an exposure of the substrate surface element;
   (h) resetting the deflecting mirror to a mirror starting position;
   (i) preparing the mirror element in the scan direction for the continuation of the exposure of the substrate surface element;
   (j) measuring a covering position between the prepared mirror element and the substrate surface element and generating a second trigger signal when a desired covering is reached; and
   (k) switching on the prepared mirror clement by the trigger signal and
   (l) continuing the exposure.

2. The lithographic method according to claim 1, in which the position of the deflecting minor in the path of rays is changed by a Piezo actuator.

3. The lithographic method according to claim 1, further comprising shifting the exposed substrate surface element perpendicular to the scan direction.

4. The lithographic method according to claim 3, in which the shifting of the exposed substrate surface element is effected by change of the position of the deflecting mirror in the path of rays perpendicular to the scan direction.

5. The lithographic method according to claim 4, in which this change is effected by a Piezo actuator.

6. The lithographic method according to claim 1, in which the shifting of the substrate surface element in the scan direction and perpendicular to the scan direction is a factor of one-half of a side length of the substrate surface element.

7. The lithographic method according to claim 6, in which the factor has arbitrary values.

8. The lithographic method according to claim 7, in which a new substrate surface is exposed, wherein the new substrate surface is larger than two substrate surface elements.

9. The lithographic method according to claim 8, wherein edges of the new substrate surface lie on a grid being a factor of one-half of a side length of the substrate surface element.

10. The lithographic method according to claim 9, wherein during a first exposure cycle, the substrate surface elements are exposed within the new substrate surface by the mirror element, the projection of which onto the substrate occurs via the deflecting mirror that is not displaced either in the scan direction or perpendicular to the scan direction.

11. The lithographic method according to claim 10, wherein during a second exposing cycle, the still unexposed parts of the new substrate surface arc exposed by the mirror element, which exposes substrate surface elements whose position is shifted by deflection of the deflecting mirror in the scan direction and perpendicular to the scan direction in each case by a factor of one-half times the side length of the substrate surface element.

12. The lithographic method according to claim 1, in which the partial exposure of the substrate surface elements alters after each resetting of the deflecting mirror.

13. An apparatus for implementing the a photo-lithographic method of claim 1, the apparatus comprising:
   a computer system in communication with a digital. signal processor, a logic array and a random access memory, the computer system adapted to process and communicate layout data of a pixel pattern to be transferred onto the photosensitive substrate; the digital signal processor and logic array in communication with the computer system, the random access memory, a spatial light modulator, a scan sled and a linear measuring system, the digital signal processor and logic array cooperating with a projector-substrate distance measuring means disposed to measure an exact distance of a projector optics of a projection lens system to the photosensitive substrate and to adjust the distance, and with a substrate alignment means disposed to exactly measure and align each substrate to he exposed along a scan direction of the scan sled;

the spatial light modulator to redirect a bundle of ultra-violet light rays from a condenser optic of an ultra-violet light source toward a 45° mirror actuator; the 45° mirror actuator under control of the signal processor and logic array is disposed to optically shift the bundle of UV light rays along an appropriate projection axis path, through the projection lens system and onto the photosensitive substrate; and the movable scan sled, on which the photosensitive substrate is mounted, is disposed in the projection axis path of the bundle of ultra-violet light rays, the photosensitive substrate mounted to the sled being movable relative to the projector optics of the projection lens system under the control of the signal processor and logic array, with positioning and rate of movement of the substrate relative to the projector optics being determined by signals to and from a projector-substrate distance means, a substrate alignment means and a linear measuring system means in communication with the-signal processor and logic array.

14. The apparatus of claim 13, wherein the spatial light modulator comprises a digital mirror device and having a digital mirror array.

15. An apparatus to masklessly transfer a pattern onto a photosensitive substrate applying the method of claim 1, the apparatus comprising:

a mirror actuator to dispose a reflecting mirror at a predetermined angle;

a plurality of mirror elements, a first mirror element of the plurality of mirror elements to reflect a bundle of ultra-violet rays onto the reflecting mirror and further onto a predetermined location of the photosensitive substrate; and a projection optics device disposed between the reflecting mirror and the photosensitive substrate, wherein the bundle of ultra-violet rays pass through the projection optics device;

wherein the mirror actuator and the photosensitive substrate are simultaneously moved, the minor actuator moving the reflecting mirror relative to the plurality of mirror elements by a sub-pixel amount and the photosensitive substrate moving such that the bundle of ultra-violet rays is received on the predetermined location.

16. The apparatus of claim 15, wherein the sub-pixel amount is one half a pixel.

17. The apparatus of claim 15, further comprising:

means to move the photosensitive substrate by the sub-pixel amount.

\* \* \* \* \*

UNITED STATES PATENT AND TRADEMARK OFFICE
CERTIFICATE OF CORRECTION

| | | |
|---|---|---|
| PATENT NO. | : 7,982,853 B2 | Page 1 of 1 |
| APPLICATION NO. | : 11/913416 | |
| DATED | : July 19, 2011 | |
| INVENTOR(S) | : Dariusz Skibicki et al. | |

It is certified that error appears in the above-identified patent and that said Letters Patent is hereby corrected as shown below:

In Col. 6, line 1, replace the phrase "(f) repeating steps (b) to (c)" with --(f) repeating steps (b) to (e)--.

In Col. 6, line 15, replace the phrase "(k) switching on the prepared mirror clement" with --(k) switching on the prepared mirror element--.

In Col. 6, line 19, replace the phrase "the position of the deflecting minor" with --the position of the deflecting mirror--.

In Col. 6, line 59, replace the phrase "implementing the a photo-litho" with --implementing the photo-litho--.

In Col. 6, line 61, replace the phrase "with a digital. signal" with --with a digital signal--.

In Col. 8, line 19, replace the phrase ", the minor actuator" with --, the mirror actuator--.

Signed and Sealed this
Eighteenth Day of October, 2011

David J. Kappos
*Director of the United States Patent and Trademark Office*